United States Patent
Bartsch et al.

(10) Patent No.: US 10,881,007 B2
(45) Date of Patent: Dec. 29, 2020

(54) RECONDITION PROCESS FOR BGA USING FLUX

(71) Applicant: International Business Machines Corporation, Armonk, NY (US)

(72) Inventors: Tim A. Bartsch, Stewartville, MN (US); James D. Bielick, Pine Island, MN (US); David J. Braun, St. Charles, MN (US); Jennifer I. Bennett, Rochester, MN (US); Timothy P. Younger, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 180 days.

(21) Appl. No.: 15/724,883

(22) Filed: Oct. 4, 2017

(65) Prior Publication Data

US 2019/0099817 A1  Apr. 4, 2019

(51) Int. Cl.
| | |
|---|---|
| *H05K 3/34* | (2006.01) |
| *H05K 3/22* | (2006.01) |
| *B23K 1/00* | (2006.01) |
| *B23K 1/008* | (2006.01) |
| *B23K 1/20* | (2006.01) |
| B23K 101/42 | (2006.01) |

(52) U.S. Cl.
CPC ............ *H05K 3/225* (2013.01); *B23K 1/008* (2013.01); *B23K 1/0016* (2013.01); *B23K 1/203* (2013.01); *H05K 3/34* (2013.01); *B23K 2101/42* (2018.08); *H05K 3/3489* (2013.01); *H05K 2203/043* (2013.01); *H05K 2203/17* (2013.01)

(58) Field of Classification Search
CPC .................................................. B23K 1/203
USPC ............................................................ 228/119
See application file for complete search history.

(56) References Cited

U.S. PATENT DOCUMENTS

| | | | | | |
|---|---|---|---|---|---|
| 4,369,287 | A | * | 1/1983 | Hutchinson | B23K 35/3613 428/385 |
| 4,927,069 | A | * | 5/1990 | Ushikubo | B23K 1/00 228/123.1 |
| 5,568,894 | A | * | 10/1996 | Gileta | B23K 1/085 228/219 |
| 5,748,450 | A | * | 5/1998 | Kim | H05K 3/225 174/261 |

(Continued)

FOREIGN PATENT DOCUMENTS

| | | |
|---|---|---|
| EP | 513522 A2 | 11/1992 |
| JP | 62227571 A * | 10/1987 |

(Continued)

OTHER PUBLICATIONS

Grace Period Disclosure by a Joint Inventor.

*Primary Examiner* — Erin B Saad
*Assistant Examiner* — Carlos J Gamino
(74) *Attorney, Agent, or Firm* — Patterson + Sheridan, LLP

(57) ABSTRACT

Methods for refurbishing a circuitry device are disclosed. The methods described herein include applying a first flux to solder contacts connecting a first member of a circuitry device to a second member of the circuitry device; performing a first setting process on the circuitry device with the first flux; applying a second flux to the solder contacts of the circuitry device; performing a second setting process on the circuitry device; and reflowing the solder contacts.

15 Claims, 3 Drawing Sheets

(56) References Cited

U.S. PATENT DOCUMENTS

| | | | | |
|---|---|---|---|---|
| 6,116,494 | A * | 9/2000 | Brown | B23K 1/012 228/119 |
| 6,121,689 | A * | 9/2000 | Capote | B23K 35/025 257/773 |
| 6,399,426 | B1 * | 6/2002 | Capote | H01L 21/563 257/E21.503 |
| 6,610,559 | B2 * | 8/2003 | Wang | H01L 21/563 438/108 |
| 6,799,712 | B1 * | 10/2004 | Austen | B23K 1/008 219/413 |
| 8,007,627 | B2 * | 8/2011 | Nishida | H01L 21/563 156/306.6 |
| 10,172,244 | B1 * | 1/2019 | Cocchini | H05K 3/4614 |
| 2003/0113952 | A1 * | 6/2003 | Sambasivam | H01L 21/563 438/108 |
| 2004/0211817 | A1 * | 10/2004 | Jin | B23K 1/008 228/42 |
| 2007/0221710 | A1 * | 9/2007 | Akamatsu | B23K 1/203 228/223 |
| 2009/0166398 | A1 * | 7/2009 | Kishi | B23K 3/0653 228/203 |
| 2009/0184407 | A1 * | 7/2009 | Arvin | H01L 21/56 257/678 |
| 2010/0270276 | A1 * | 10/2010 | Cookson | B23K 1/0056 219/121.66 |
| 2012/0228013 | A1 * | 9/2012 | Matienzo | H05K 3/225 174/258 |
| 2013/0037957 | A1 * | 2/2013 | Takahashi | B23K 35/3612 257/772 |
| 2014/0339289 | A1 * | 11/2014 | Ootorii | B23K 1/20 228/176 |
| 2015/0258638 | A1 * | 9/2015 | Hu | B23K 35/362 228/223 |
| 2016/0353583 | A1 | 12/2016 | Hippin et al. | |
| 2019/0009375 | A1 * | 1/2019 | Hayashi | B23K 35/262 |
| 2020/0043880 | A1 * | 2/2020 | Mohammed | H01L 24/17 |

FOREIGN PATENT DOCUMENTS

| | | |
|---|---|---|
| JP | 2001156441 A | 6/2001 |
| JP | 3802824 B2 | 7/2006 |
| JP | 03187291 A | 10/2012 |
| JP | 2012227343 A | 11/2012 |
| JP | 5535122 B2 | 7/2014 |
| KR | 1020120128870 A | 11/2012 |
| KR | 101210252 B1 | 12/2012 |

* cited by examiner

RECONDITION PROCESS FOR BGA USING FLUX

STATEMENT REGARDING PRIOR DISCLOSURES BY THE INVENTOR OR A JOINT INVENTOR

On May 30, 2017, joint inventor Jennifer I. Porto stated as follows:

"This reconditioning process started at Wistron Taiwan in December of 2016. When a PCB has an issue in the field, it is sent to . . . . Wistron Taiwan (our contract manufacturer), reconditioned, and sent back . . . ."

BACKGROUND

The disclosure herein is related to refurbished printed circuit boards and methods of refurbishment. Solder joints in printed circuit boards can fail over time due to fatigue from excessive thermal cycling. Such failures can become problematic for users who power cycle their systems on a regular basis for energy conservation. The sensitive components are strained when they are subjected to temperature cycles outside the normal operating range. In these instances, it is typical to see failures of components much earlier than their projected life. Printed circuit boards that have failed can be refurbished by heating to reflow the solder at the solder joints. Current refurbishment methods have success rates lower than desired. Improved refurbishment methods are desired.

SUMMARY

Embodiments described herein provide a method, comprising applying a first flux to solder contacts connecting a first member of a circuitry device to a second member of the circuitry device; performing a first setting process on the circuitry device with the first flux; applying a second flux to the solder contacts of the circuitry device; performing a second setting process on the circuitry device; and reflowing the solder contacts.

Other embodiments described herein provide a method, comprising applying a first flux to solder contacts connecting a first member of a circuitry device to a second member of the circuitry device; performing a first setting process on the circuitry device with the first flux, the first setting process comprising orienting the circuitry device such that the first flux material wets a first portion of the solder contacts adjacent to the first member; applying a second flux to the solder contacts of the circuitry device; performing a second setting process on the circuitry device, the second setting process comprising orienting the circuitry device such that the second flux material wets a second portion of the solder contacts adjacent to the second member; and reflowing the solder contacts.

Other embodiments described herein provide a method, comprising applying a first flux to solder contacts connecting a first member of a circuitry device to a second member of the circuitry device; performing a first setting process on the circuitry device with the first flux, the first setting process comprising orienting the circuitry device such that the first flux material wets a first portion of the solder contacts adjacent to the first member and thermally processing the circuitry device; applying a second flux to the solder contacts of the circuitry device; performing a second setting process on the circuitry device, the second setting process comprising orienting the circuitry device such that the second flux material wets a second portion of the solder contacts adjacent to the second member and thermally processing the circuitry device; and reflowing the solder contacts.

DETAILED DESCRIPTION

Figure 1:
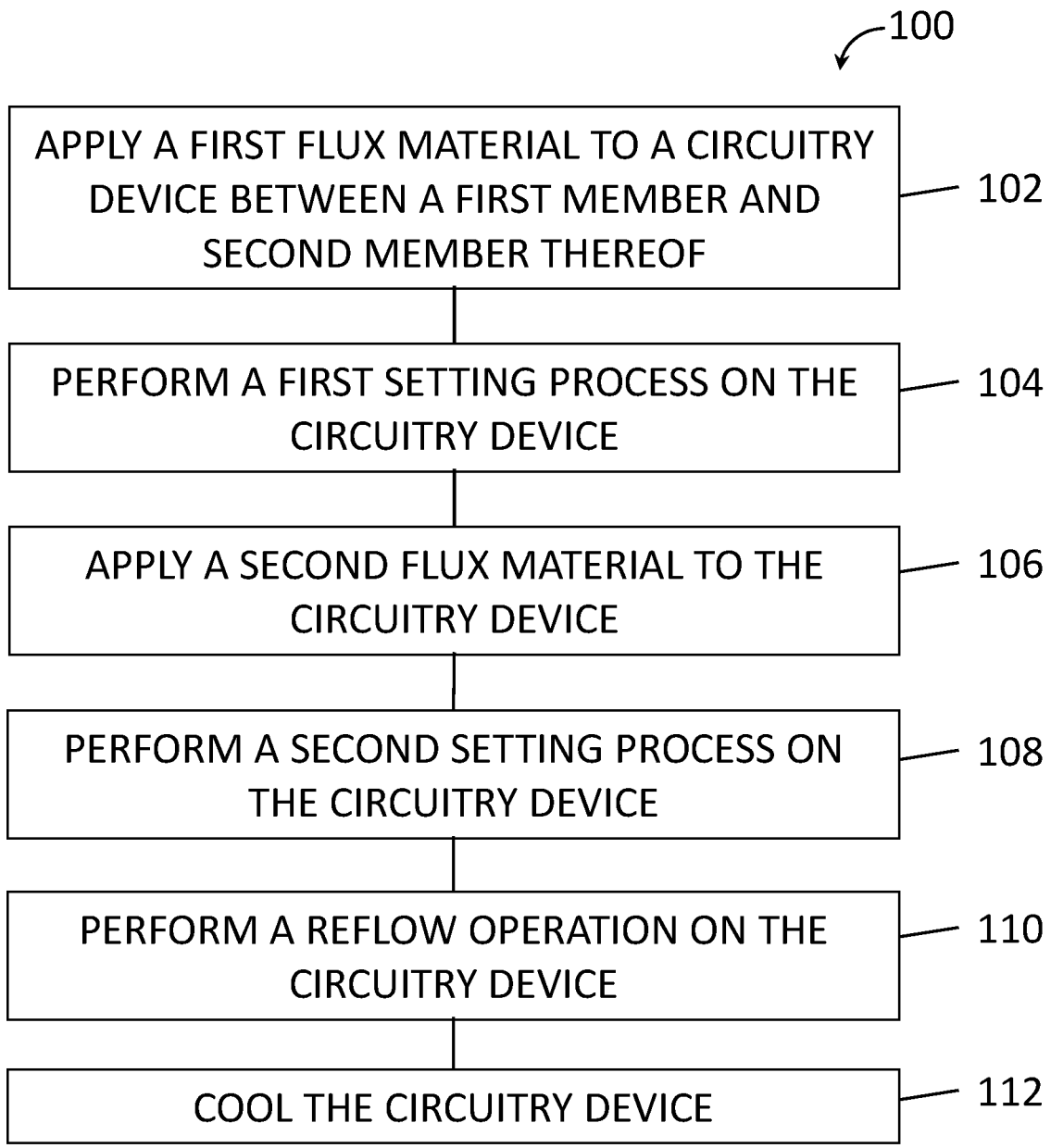
FIG. 1 is a flow diagram illustrating a method according to one embodiment.

FIG. 1 is a flow diagram illustrating a method 100 according to one embodiment. FIGS. 2A-2D are side views of a circuitry device 200 at various stages of the method 100. Reference will be made to the views of FIGS. 2A-2D in connection with the following description of the method 100.

The method 100 is an improved method of refurbishing circuitry devices having soldered contacts. An exemplary circuitry device 200, shown in FIG. 2A, has a first member 202 connected to a second member 204 by one or more solder contacts 206. The failures described above in connection with such devices typically manifest at the connection points between the solder contacts 206 and the members 202 and 204. An exemplary failure 205 is shown at one such location. These failures typically appear as cracks in the contact material. The method 100 substantially repairs all such defects.

Figure 2A:
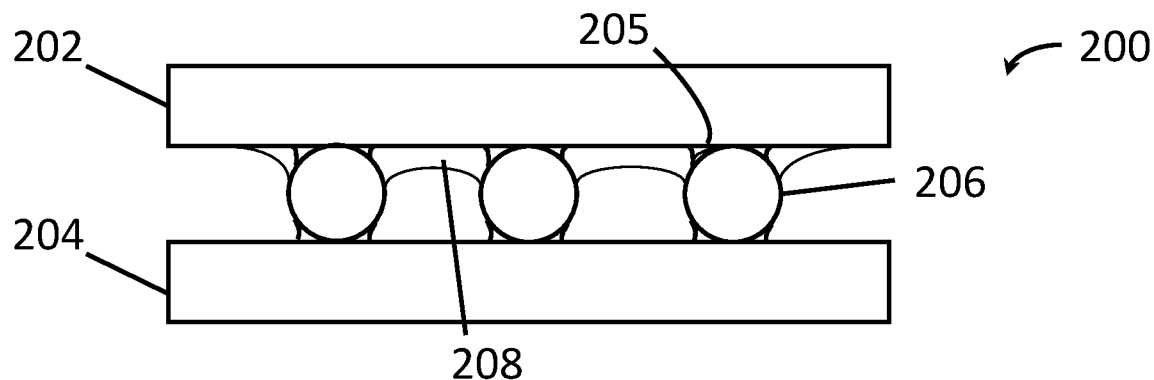
FIGS. 2A-2D are side views of a circuitry device at various stages of the method 100.

At 102, a first flux material is applied to the circuitry device between the first member 202 and the second member 204. The first flux material is applied using an appropriate applicator, such as a bottle with needle, to substantially fill the space between the first member 202 and the second member 204. When the space is filled with the first flux material, a meniscus 208 is visible at the side of the circuitry device 200, as shown in FIG. 2A. The flux material is used to coat the contact points between the solder contacts 206 and the first and second members 202 and 204, and wets at least a portion of the solder contacts 206 and at least portions of the first and second members 202 and 204.

The flux material used in the methods described herein is a commonly used material in solder applications. The flux material includes a collection of weak organic acids that function to suppress oxidation of the solder at flow temperatures and to reduce surface tension to improve wetting of molten solder. As applied, the flux material typically includes a solvent to facilitate wetting of the flux material and filling spaces in the circuitry device 200. An exemplary flux material is the FP-500 flux available from Indium Corp. of Clinton, N.Y.

Prior to application of the flux material, sensitive portions of the circuitry device may be covered or masked. A masking tape resistant to temperature, such as Kapton tape, may be used. Any temperature sensitive components that can be removed from the circuitry device are typically removed prior to performing any thermal processes on the device. Any dust and debris on the circuitry device is also removed by compressed air blow off, or similar treatment.

At 104, the circuitry device 200 is subjected to a first setting process to set the first flux material. The first setting process may include a thermal process. A typical thermal process involves maintaining the circuitry device 200, with the flux material inside, at a temperature of about 100° C. for a period of 10 minutes to set or dry the flux material. The temperature and time may vary, where higher temperatures can be used for shorter times, up to a decomposition temperature of the flux material, for example around 150° C., and lower temperatures for longer times. In other embodiments, the first setting process may be an ambient temperature process, in which the circuitry device 200 is maintained at ambient temperature for about 30 minutes, or longer, to set the first flux material. In the ambient temperature or thermal setting processes, the circuitry device may be disposed in a dry atmosphere, which may be maintained at a reduced pressure below atmospheric pressure to accelerate removal of solvent and setting of the flux material.

During the first setting process, the circuitry device 200 is oriented to allow gravity to draw the first flux material to the contact points between the solder contacts 206 and one of the first and second members 202 and 204. Alternately, the circuitry device may be arranged in a centrifuge to provide a locating force for the first flux material during the first setting process. Shown in FIG. 2B, following the first setting process, the first flux material is converted to a first flux residue 210 coating areas of the solder contacts 206 near, for example, the first member 202.

Figure 2B:
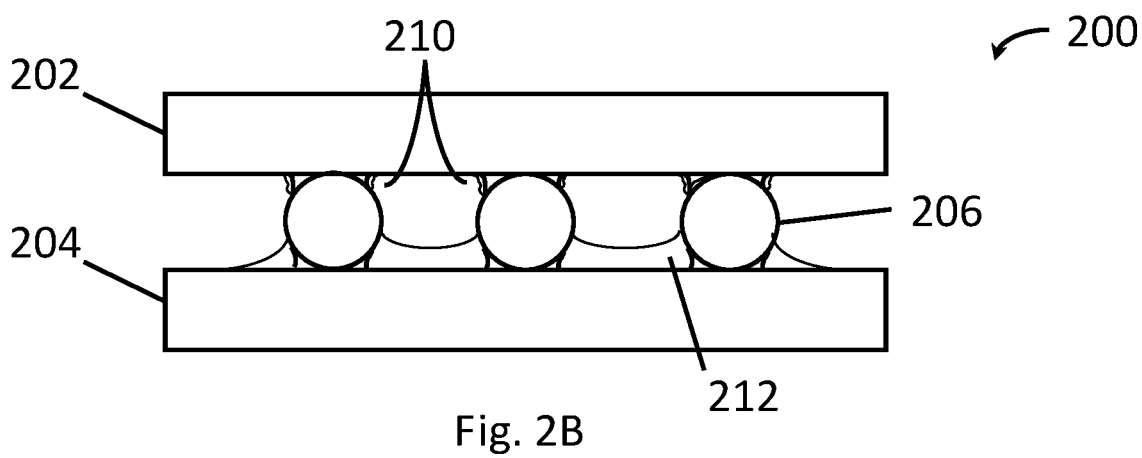

At 106, a second flux material is applied to the circuitry device 200. The second flux material may be the same material as the first flux material, or a different material. The second flux material is applied using a suitable applicator, as above, such that a meniscus 212 is visible between the solder contacts 206, as shown in FIG. 2B.

Figure 2C:
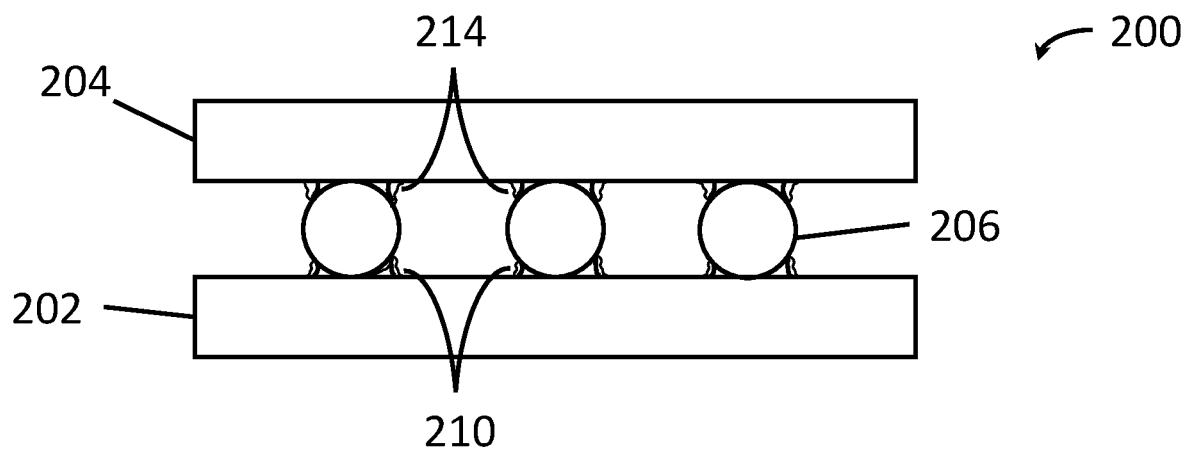

At 108, the circuitry device 200 is subjected to a second setting process to set the second flux material. The orientation of the circuitry device is reversed for the second setting process, as shown in FIG. 2C, to locate the second flux material near the contact points between the solder contacts 206 and one of the first and second members 202 and 204. If the orientation of the circuitry device 200 during the first setting process was selected to locate the first flux material adjacent to the first member 202, the orientation of the circuitry device 200 during the second setting process is selected to locate the second flux material adjacent to the second member 204, as shown by the position of the meniscus 212 in FIG. 2B, and vice versa. The second setting process may include a thermal process, as in the first setting process.

Following the second setting process, the second flux material is converted to a second flux residue 214 coating areas of the solder contacts 206 near, in this case, the second member 204, such that the solder contacts 206 have flux residues 210 and 214 adjacent to the first and second members 202 and 204.

Figure 2D:
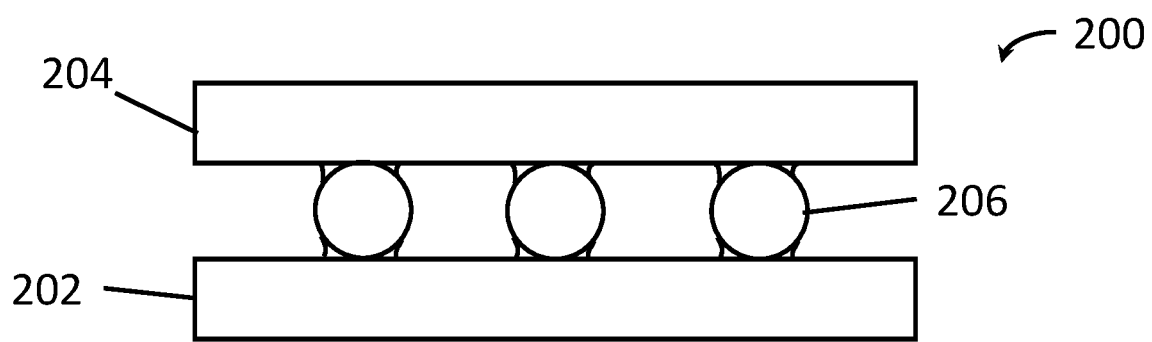

At 110, the circuitry device 200 is subjected to a reflow operation. The circuitry device 200 is heated to a solder reflow temperature, typically 215° C. to 245° C., to cause parts of the solder contacts 206 to melt. In an exemplary process, the circuitry device is heated at a first rate of about 0.5° C./sec for about 500 sec, and then at a second rate, faster than the first rate, for example about 1° C./sec, up to the target temperature. The flux residues 210 and 214 soften and blend with the molten solder, and the blend flows into the defects, such as defect 205, causing them to be filled with molten solder. This eliminates the defect, so the defect 205 disappears, as shown in FIG. 2D. The flux residues are substantially volatilized at the solder reflow temperature, leaving molten solder filling the defects. The circuitry device 200 may be maintained at or near the target temperature for a target period, for example 30 sec to 200 sec.

During the reflow operation, pressure may be applied to the first and second members 202 and 204 to ensure proper placement of reflowed solder at the solder contacts 206. Applying pressure may also marginally reduce the size of any defects at the solder contacts 206, thus increasing the effectiveness of the molten solder in filling the defects. Pressure may be applied by mounting the circuitry device on a support frame that holds the circuitry device along one or more edges thereof. A pressure device may then be applied to an appropriate location of either the first or second member. The pressure device may be a simple weight laid on the circuitry device, or the pressure device may be mounted and secured to the support frame or to a pressure applicator.

At 112, the circuitry device 200 is allowed to cool to ambient temperature to solidify the solder. The rate of cooling may be controlled between about 0.5° C./sec and about 1° C./sec, for example about 0.7° C./sec. During cooling, the circuitry device 200 may be allowed to rest for a period of time at an elevated temperature, such as about 50° C. for a rest period of 30 sec to 200 sec. The rest period may strengthen the solder connections by ensuring all volatile materials are removed from the solder connections.

Following the reflow process, excess flux residue may be removed by spot washing with solvent. Alcohol, or a water alcohol mixture, may be used. A solvent, or solvent mixture may be applied in a first application, and an aqueous wash may be used to remove the solvent. Alternately, the solvent may be allowed to dry.

In the foregoing disclosure, reference is made to various embodiments. However, the scope of the present disclosure is not limited to specific described embodiments. Instead, any combination of the disclosed features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages described herein are merely illustrative and are not considered elements or limitations of the appended claims except where explicitly recited in a claim(s).

The flowchart and block diagrams in the Figures illustrate operations and methods used in various embodiments. In this regard, each block in the flowchart may represent a specific operation performed as part of the described methods. In some alternative implementations, the functions noted in the block may occur out of the order noted in the figures. For example, two blocks shown in succession may be performed substantially concurrently, or the blocks may sometimes be performed in the reverse order, depending upon the method. It will also be noted that each block of the block diagrams and/or flowchart illustration, and combinations of blocks in the block diagrams and/or flowchart illustration, can be implemented by special purpose hardware-based systems that perform the specified functions or acts or combinations of functions or acts.

While the foregoing is directed to embodiments of the present invention, other and further embodiments of the invention may be devised without departing from the basic scope thereof, and the scope thereof is determined by the claims that follow.

What is claimed is:

1. A method comprising:
applying a first flux to solder contacts connecting a first member of a circuitry device to a second member of the circuitry device, wherein the first member and the second member are connected prior to the applying the first flux;
performing a first setting process on the circuitry device with the first flux, the first setting process comprising orienting the circuitry device such that the first flux material wets a first portion of the solder contacts adjacent to the first member;
applying a second flux to the solder contacts of the circuitry device;
performing a second setting process on the circuitry device, the second setting process comprising inverting the circuitry device such that the second flux material wets a second portion of the solder contacts adjacent to the second member; and
performing a reflow operation on the circuitry device.

2. The method of claim 1, wherein the first setting process comprises thermally processing the circuitry device.

3. The method of claim 1, wherein the second setting process comprises thermally processing the circuitry device.

4. The method of claim 1, wherein at least one of the first setting process or the second setting process comprises exposing the circuitry device to an atmosphere of reduced pressure.

5. The method of claim 1, wherein the reflow operation comprises heating the circuitry device at a first rate for a first period and a second rate, higher than the first rate, for a second period.

6. The method of claim 5, wherein the reflow operation comprises maintaining the circuitry device at a target temperature for a target period.

7. The method of claim 6, wherein the reflow operation further comprises applying pressure to the circuitry device.

8. The method of claim 7, further comprising, after the reflow operation, cooling the circuitry device to ambient temperature at a controlled cooling rate.

9. A method comprising:
applying a first flux to solder contacts connecting a first member of a circuitry device to a second member of the circuitry device, wherein the first member and the second member are connected prior to the applying the first flux;
performing a first setting process on the circuitry device with the first flux, the first setting process comprising orienting the circuitry device such that the first flux material wets a first portion of the solder contacts adjacent to the first member;
applying a second flux to the solder contacts of the circuitry device;
performing a second setting process on the circuitry device, the second setting process comprising inverting the circuitry device such that the second flux material wets a second portion of the solder contacts adjacent to the second member; and
performing a reflow operation on the circuitry device, wherein at least one of the first setting process or the second setting process comprises exposing the circuitry device to an atmosphere of reduced pressure.

10. The method of claim 9, wherein the first setting process comprises thermally processing the circuitry device.

11. The method of claim 9, wherein the second setting process comprises thermally processing the circuitry device.

12. The method of claim 9, wherein the reflow operation comprises heating the circuitry device at a first rate for a first period and a second rate, higher than the first rate, for a second period.

13. The method of claim 12, wherein the reflow operation comprises maintaining the circuitry device at a target temperature for a target period.

14. The method of claim 13, wherein the reflow operation further comprises applying pressure to the circuitry device.

15. The method of claim 14, further comprising, cooling the circuitry device to ambient temperature at a controlled cooling rate after the reflow operation.

\* \* \* \* \*